(12) United States Patent
Hall et al.

(10) Patent No.: US 10,411,499 B2
(45) Date of Patent: Sep. 10, 2019

(54) DISTRIBUTED CHARGE CONTROLLER

(71) Applicants: David R. Hall, Provo, UT (US); Seth Myer, Eagle Mtn., UT (US); Joe Fox, Spanish Fork, UT (US)

(72) Inventors: David R. Hall, Provo, UT (US); Seth Myer, Eagle Mtn., UT (US); Joe Fox, Spanish Fork, UT (US)

(*) Notice: Subject to any disclaimer, the term of this patent is extended or adjusted under 35 U.S.C. 154(b) by 69 days.

(21) Appl. No.: 15/588,233

(22) Filed: May 5, 2017

(65) Prior Publication Data

US 2018/0323639 A1    Nov. 8, 2018

(51) Int. Cl.
*H02J 7/35* (2006.01)
*H02J 7/00* (2006.01)
*H02S 40/38* (2014.01)
*H01L 31/05* (2014.01)

(52) U.S. Cl.
CPC ............ *H02J 7/35* (2013.01); *H01L 31/0504* (2013.01); *H02J 7/0008* (2013.01); *H02J 7/0019* (2013.01); *H02J 7/0021* (2013.01); *H02S 40/38* (2014.12)

(58) Field of Classification Search
CPC ............................... H02J 3/383; H01L 31/042
USPC .......................................... 320/101; 136/244
See application file for complete search history.

(56) References Cited

U.S. PATENT DOCUMENTS

| | | | | |
|---|---|---|---|---|
| 6,353,304 B1* | 3/2002 | Atcitty | ............... | H01M 10/441 320/116 |
| 8,633,671 B2* | 1/2014 | Kelly | ................. | H01M 10/465 136/244 |
| 9,331,499 B2* | 5/2016 | Ikriannikov | .............. | H02J 1/10 |
| 9,368,964 B2* | 6/2016 | Adest | ...................... | H02J 1/102 |
| 9,882,528 B2* | 1/2018 | Wolter | ...................... | H02J 7/35 |
| 9,996,060 B2* | 6/2018 | Husen | ....................... | H02J 3/14 |
| 2012/0116699 A1* | 5/2012 | Haag | ..................... | B60L 3/0046 702/63 |
| 2012/0204051 A1* | 8/2012 | Murakami | ............ | G06F 9/5088 713/324 |
| 2012/0249047 A1* | 10/2012 | Kelly | ................. | H01M 10/465 320/101 |
| 2013/0201027 A1* | 8/2013 | Bucher | ................... | H02S 50/10 340/660 |
| 2014/0095915 A1* | 4/2014 | Hitchcock | ............ | G06F 1/3212 713/323 |
| 2014/0157580 A1* | 6/2014 | Fukumochi | ......... | H01L 31/0512 29/593 |
| 2018/0172751 A1* | 6/2018 | Takeuchi | ............ | H01L 31/0443 |

* cited by examiner

*Primary Examiner* — M Baye Diao

(57) ABSTRACT

A distributed charge controller that matches a charging and power profile of each individual battery cell within a bank of batteries with one or more strings of photovoltaic (PV) cells in order to maintain battery health and performance. The charge controller further optimizes the performance of a solar module by allowing active unshaded strings of cells to operate independently of other strings within the module that may be shaded. Strings of PV cells are selectively matched to one or more battery cells as required.

18 Claims, 11 Drawing Sheets

DISTRIBUTED CHARGE CONTROLLER

BACKGROUND

Field of the Invention

This invention generally relates to modular photovoltaic solar power systems that charge batteries.

Background of the Invention

Autonomous solar power systems typically have a series of solar panels or solar photovoltaic (PV) modules connected together that feed into a charge controller that charges a bank of batteries. These autonomous systems are ideal for remote locations with electrical loads that require power but may not have access to the utility grid.

The described typical autonomous system may also be referred to as an "off-grid" solar power system. Most off-grid solar power systems include a charge controller that charges the batteries. Some charge controllers use a pulse width modulation (PWM) algorithm to charge the batteries. Others use a maximum power point tracking (MPPT) algorithm to charge the batteries. The MPPT is typically more effective in charging the batteries in that it is able to more closely match the voltage and current to levels that match the battery charging profile. The MPPT is also more shade tolerant in that it still is able to use even low power output from the solar modules.

Existing off grid solar power systems are packaged systems that are configured for 12 volt, 24 volt or other standard battery voltages. They typically are configured to receive input voltage and current from one or more solar modules, not individual strings of PV cells within each module.

Many battery chemistry types such as Lithium Iron Phosphate require specialized charge controllers that charge each battery cell individually. For example a standard Lithium Iron Phosphate cell is at 3.2 volts. In order to maximize the amount of energy collected by each string of PV cells to each individual battery cell, a higher resolution is required. In other words, rather than simply receiving the total voltage and current output from one or more solar modules and charging a bank of batteries comprising a multitude of individual battery cells, a system is needed that can match one or more individual strings from one or more solar modules to each individual battery cell in turn. By more closely matching strings of PV cells to individual battery cells, the efficiency of the entire system may be maximized.

SUMMARY

A distributed charge control system, as described herein, matches strings of PV cells within one or more solar modules to individual battery cells in order to maximize power output of the solar cells and maximize the charging capacity.

The distributed charge control system matches a charging and power profile of each individual battery cell within a bank of batteries with one or more strings of photovoltaic (PV) cells in order to maintain battery health and performance. The charge controller further optimizes the performance of a solar module by allowing active unshaded strings of cells to operate independently of other strings within the module that may be shaded or otherwise nor producing power. Strings of PV cells are selectively matched to one or more battery cells as required.

This invention has been developed in response to the present state of the art and, in particular, in response to the problems and needs in the art that have not yet been fully solved by currently available systems and methods. Features and advantages of different embodiments of the invention will become more fully apparent from the following description and appended claims, or may be learned by practice of the invention as set forth hereinafter.

Consistent with the foregoing, a distributed charge control system is disclosed, which includes one or more photovoltaic (PV) modules producing a current, each PV module comprising one or more strings of PV cells connected in series. In certain embodiments, the system further includes a charge controller comprising a processor, memory and control electronics, along with a battery bank comprising a plurality of battery cells connected in series. The charge controller selectively connects each string of the one or more strings of PV cells to selectively charge one or more of the battery cells based on predefined logic.

In an embodiment, each string of the one or more strings of PV cells is connected to a specific battery cell, the charge controller matching the voltage and current charging specifications of the specific battery cell.

In another embodiment, two or more strings of the PV cells are connected to a first battery cell, the charge controller matching the voltage and current charging specifications of the first battery cell for a first period of time until the first cell is fully charged, whereupon the charge controller then switches charging to a second battery cell for a second period of time. In an embodiment, the charge controller further uses maximum power point tracking logic and electronics. In certain embodiments, the predefined logic includes at least one or more of the following: logic preprogrammed at a manufacturer; user defined logic; logic based on calculations from sensor inputs; and logic based on calculations from charts and lookup tables stored in the memory.

In certain embodiments, the sensor inputs are received from sensors both within the control system and outside of the control system. The sensors include one or more of the following sensor types: sensors that sense voltage; current; temperature; deformation of battery cells; increase in internal pressure inside battery cells; state of charge of individual battery cells; charge rate of cells; and discharge rate of cell.

In an embodiment, the battery cells comprise lithium iron phosphate chemistry. In another embodiment, the sensor inputs include identifying inputs from sensors that indicate battery chemistry type. In another embodiment, the control system adjusts charging current, and charging rate based on the identifying inputs indicating battery type.

In certain embodiments, the sensor inputs indicate a time period during which an unproductive string of PV cells are not producing minimum voltage and current levels because they are shaded or obstructed, whereupon the charge controller switches charging to a productive string of PV cells. In another embodiment, the charge controller connects multiple strings of the two or more strings of PV cells in one or more PV modules in series in order to increase the voltage output. In an embodiment, the charge controller of a first PV module is in communication with one or more charge controllers of one or more additional PV modules allowing the extension of all of the functions of a single distributed charge control system to a combined system of PV modules.

In certain embodiments, the charge controller selectively connects two or more strings of PV cells from two or more PV modules to selectively charge one or more of the battery cells based on the predefined logic. In one embodiment, the charge controller determines from the sensor inputs, non-productive strings of the one or more strings of PV cells which are damaged or non-productive, and isolates the non-productive strings from the system. In another embodiment, the charge controller monitors and controls the use of each battery cell based on a scheduled health and maintenance profile stored in the memory, maintaining and updating the health and maintenance profile related to each individual battery cell.

In an embodiment, the charge controller adjusts a unique battery cell specific charging profile and discharge profile for each individual battery cell according to the health and maintenance profile for that unique battery cell. In another embodiment, the charge controller calculates a target power based on a charging profile of the battery cell, and adjusts the charging and discharging of the battery cell based on the target power. In an embodiment, the charge controller calculates a target group power based on a charging profile of a specific group of battery cells, and adjusts the charging and discharging of the specific group of battery cells based on the target group power.

In an embodiment, the charge controller selectively combines power outputs of one or more strings of PV cells and one or more battery cells to meet an electrical load based on power requirements of the electrical load, the target power of the battery cells, and the power available from the one or more strings of PV cells.

There are two main novel features unique to the distributed charge control system.

The first differentiating feature is the ability of the system to selectively connect one or more individual strings of PV cells to one specific battery cell. This allows the voltage to be more closely matched to the specific requirements of the battery chemistry, battery construction and configuration. For example, the typical Lithium Iron Phosphate cell is at a nominal 3.2 volts. Many solar panels are at a much higher voltage, in the 18 volts up to 38 volt range. In order to charge an individual battery cell, the voltage must be brought down to a lower voltage within about the 3.5 volts to 4.5 volt range. By matching the voltage of the solar cells more closely to each individual cell, more control is available in charging the cells. Also, the charge rate is much more efficient. With DC to DC voltage regulation, energy losses may occur, even in very efficient DC to DC conversion circuits. By matching the voltages, these losses may be mitigated or nearly eliminated.

This selective matching of PV strings to individual battery cells also increases the efficiency of charge controlling functions such as maximum power point tracking (MPPT). A typical MPPT charge controller must convert the voltage from a higher input voltage down to a lower 3.5 or 4.0 volt level to match each individual battery cell. The MPPT function also has the additional ability to selectively combine one or more strings of PV cells as needed to maximize the efficiency of battery charging. For example, if one of the solar strings is partially shaded, or if a string fails completely, the lower producing or failed strings may be isolated from the active energy producing strings to perform the charging function. Sub-par strings that are not producing enough energy to create the minimum required voltage and current necessary to charge a battery cell may be combined with other strings of cells, either in series or in parallel, to augment the low power string and increase the charge rate to meet the requirements. This may be done in real time in order to actively manage the charging to meet changing conditions, for example as clouds pass over and cause shading.

The second differentiating feature is the ability of the system to actively manage each individual string of solar cells within a solar module. A typical solar module has all of the strings of PV cells in series, producing a voltage in the 12 volt to 42 volt range, depending on the size of the module and how many PV cells are in series. With the this typical configuration, even shading on one portion of the PV cells reduces the current in the whole string of cells. Even if most of the PV cells within a PV module may be in full sunlight, if a portion of the cells are shaded the PV module power output is limited by the few PV cells that are shaded.

This shading issue is mitigated with the distributed charge control system by isolating the shaded strings from the active strings within the module. The charge controller monitors each PV string and selectively connects each productive string to the appropriate battery cell. By actively monitoring and controlling both the connections to each individual PV string, and the connections to each individual battery cell, the charge controller maximizes the energy delivered to the battery cells.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION OF THE DRAWINGS

Figure 1:
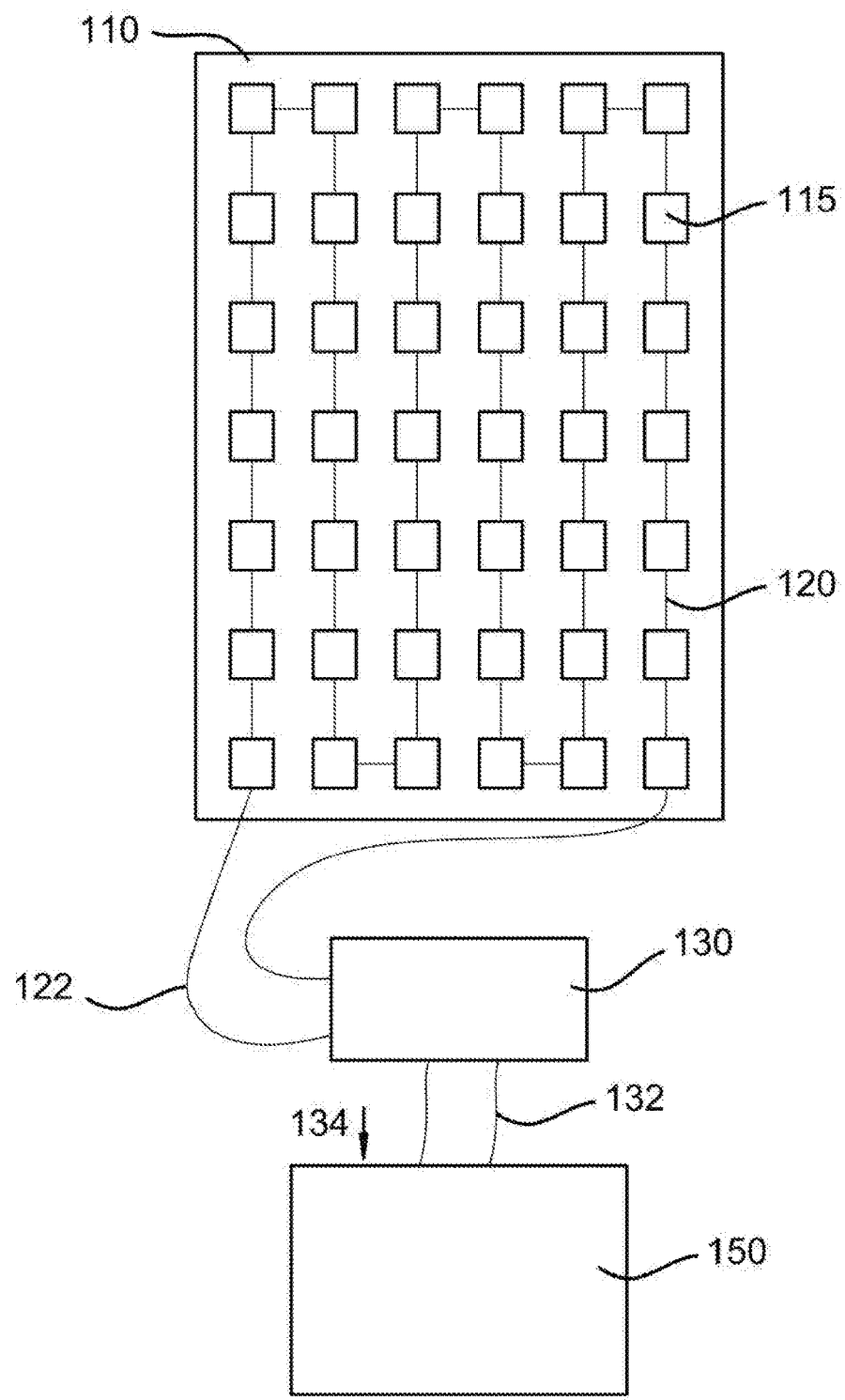
FIG. 1 is a diagram of a typical off-grid solar PV system.

The description that follows includes systems, methods, techniques, instruction sequences, and computing machine program products that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

In various embodiments, a system as described herein determines how a distributed charge control system is functionally accomplished.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence.

For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

FIG. 1 is a diagram of a typical off-grid solar PV system. A single PV module 110 is shown with a single string of PV cells 115 connected together by series wiring 120. The wiring 122 is fed into a charge controller 130 that controls the charging of the battery bank 150. Charging current 134 charges the battery bank 150 via wiring 132. In this example, the PV module 110 outputs 18 volts DC to the charge controller which in turn charges a 12 volt DC battery bank 150. The diagram in FIG. 1 is shown to illustrate a traditional system and how it differs from the invented distributed charge control system. In this traditional system, the inputs and outputs only allow for a single input from a solar module, along with a single output with a charging profile configured for a battery bank, not individual cells within the battery bank. Also, with this traditional system, shading of any one cell 115 within the PV module 110 will reduce the current flow throughout the entire series circuit 120.

Figure 2:
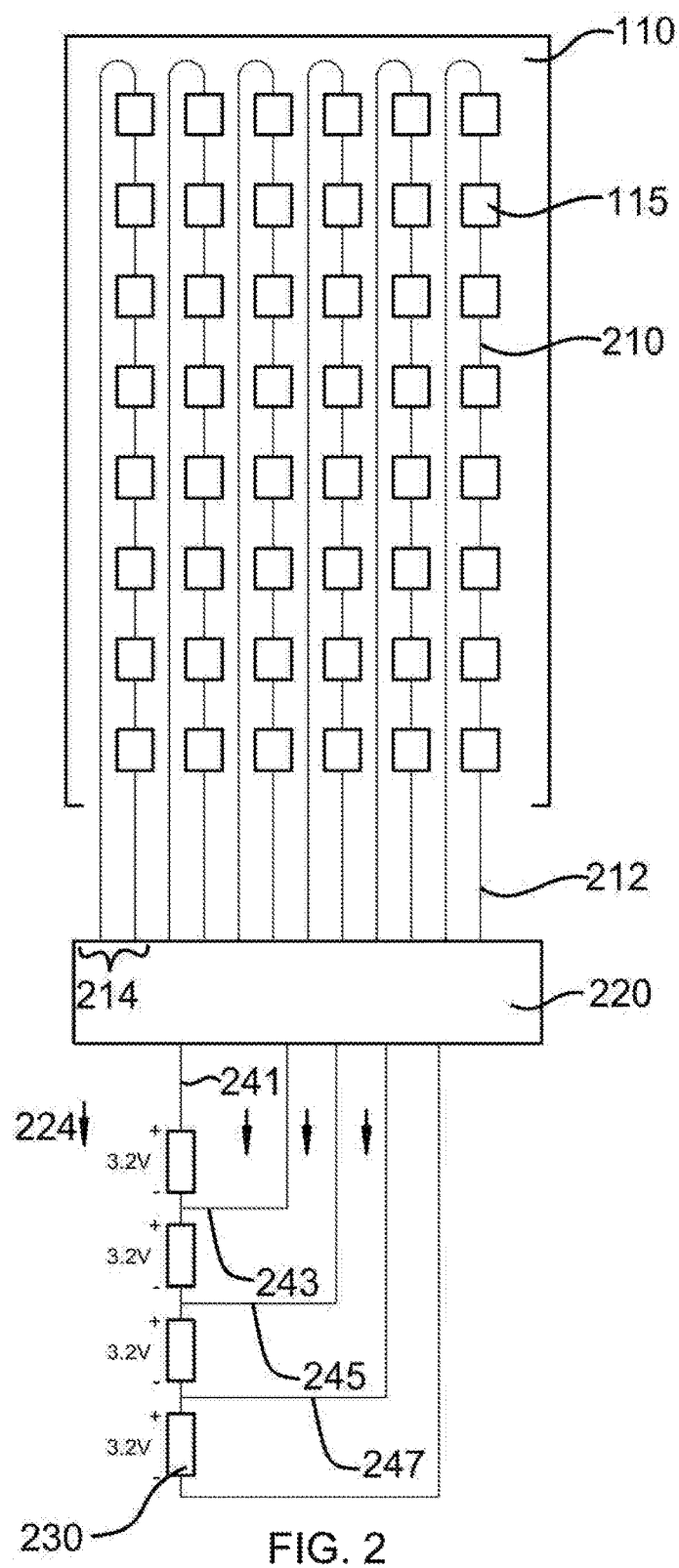
FIG. 2 is a diagram of the invented distributed charge control system with multiple PV cell strings in rows, according to an embodiment of the system.

FIG. 2 is a diagram of the invented distributed charge control system with multiple PV cell strings in rows. Solar module 110 is shown with six strings of eight PV cells 115. Each cell is 0.5 volts, so each string produces 4 volts. Each string 214 connects to the charge controller 220. The charge controller distributes the charging current 224 via wiring 241 to each individual battery cell 230. In an embodiment, the controller cycles through each of the four battery cells shown in order via wiring 241, 243, 245 then 247, charging each individual battery cell one at a time. As each cell is fully charged, the charging cycle moves to the next battery cell and charges it in order. Sensors within the charge controller 220 and within each battery cell 230 communicate data regarding charging current, voltage, temperature and other required input information as required to inform the charge controller 220. The charge controller 220 then confirms the charging profile for each individual battery cell, and determines the appropriate current and voltage to deliver based on historic data, sensor data and look up table data. The charge controller 220 selects one or more strings 214 of PV cells as source power to supply the voltage and current profile needed for each battery cell in order. The charge controller 220 continuously monitors and adjusts the current and voltage flow as required in real time, selecting one or more strings to supply the appropriate charging profile.

Figure 3:
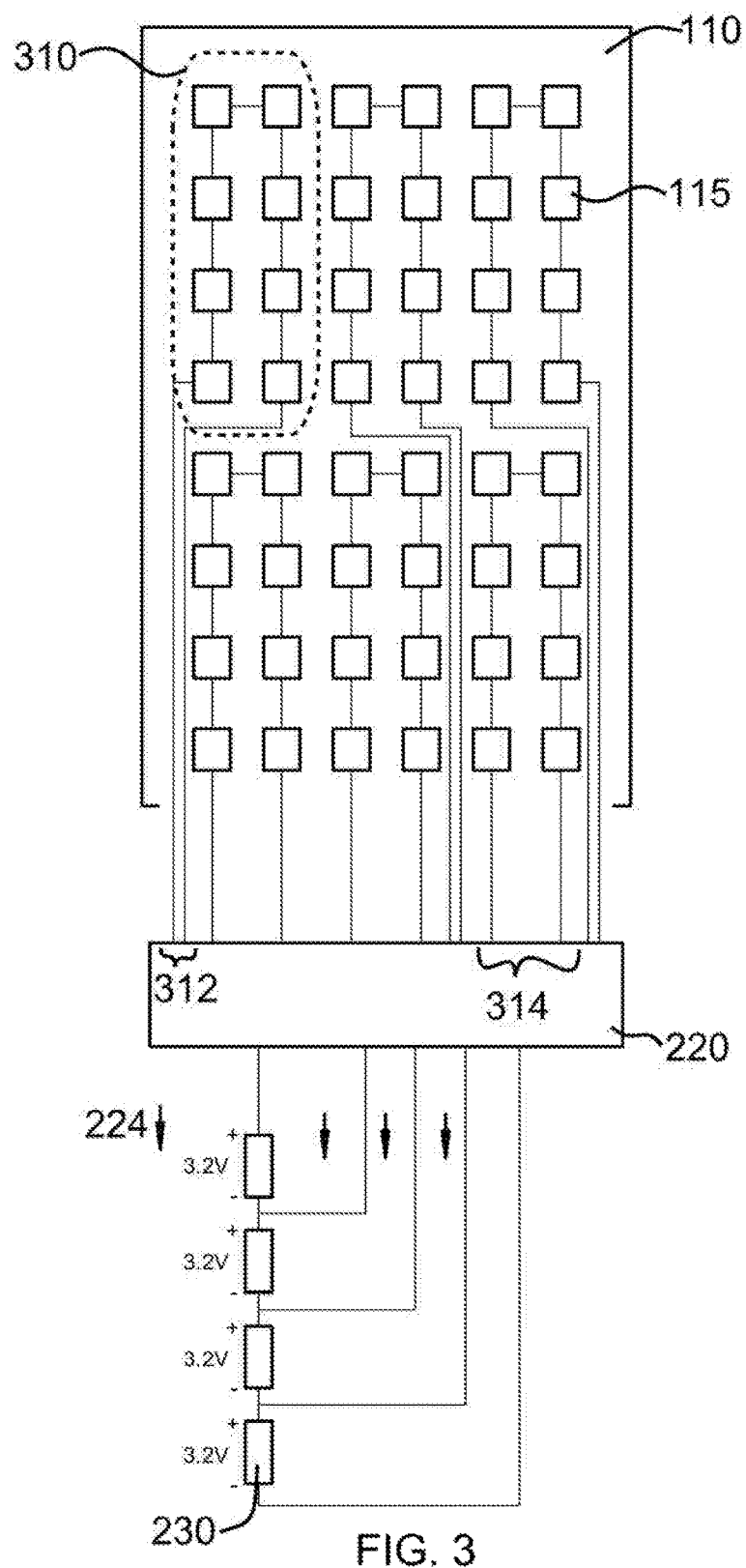
FIG. 3 is a diagram of another embodiment of the distributed charge control system with PV cell strings in clustered groups.

FIG. 3 is a diagram of another embodiment of the distributed charge control system with PV cell strings in clustered groups. The PV strings within the clusters may be arranged in a variety of configurations such as horizontal, vertical, circular, and or diagonal, or a combination thereof. The PV strings may have an equal or unequal number of cells. Such configurations and number of cells may be useful in designing the system to accommodate locations where ambient and environmental conditions are likely to affect PV performance. The PV module 110 is shown with six clusters of eight PV cells 115. Each cluster 310 comprises eight PV cells 115 at 0.5 volts each for a total of 4 volts for each string. String 312 from an upper section and string 314 from a lower section are examples of how strings are connected to the charge controller 220. Current 224 indicated by arrows, flows into each of the battery cells 230 in order, charging each battery cell as required to meet each specific battery cell's charging profile. In this example, each battery cell is charged to a nominal 3.2 volts.

Figure 4:
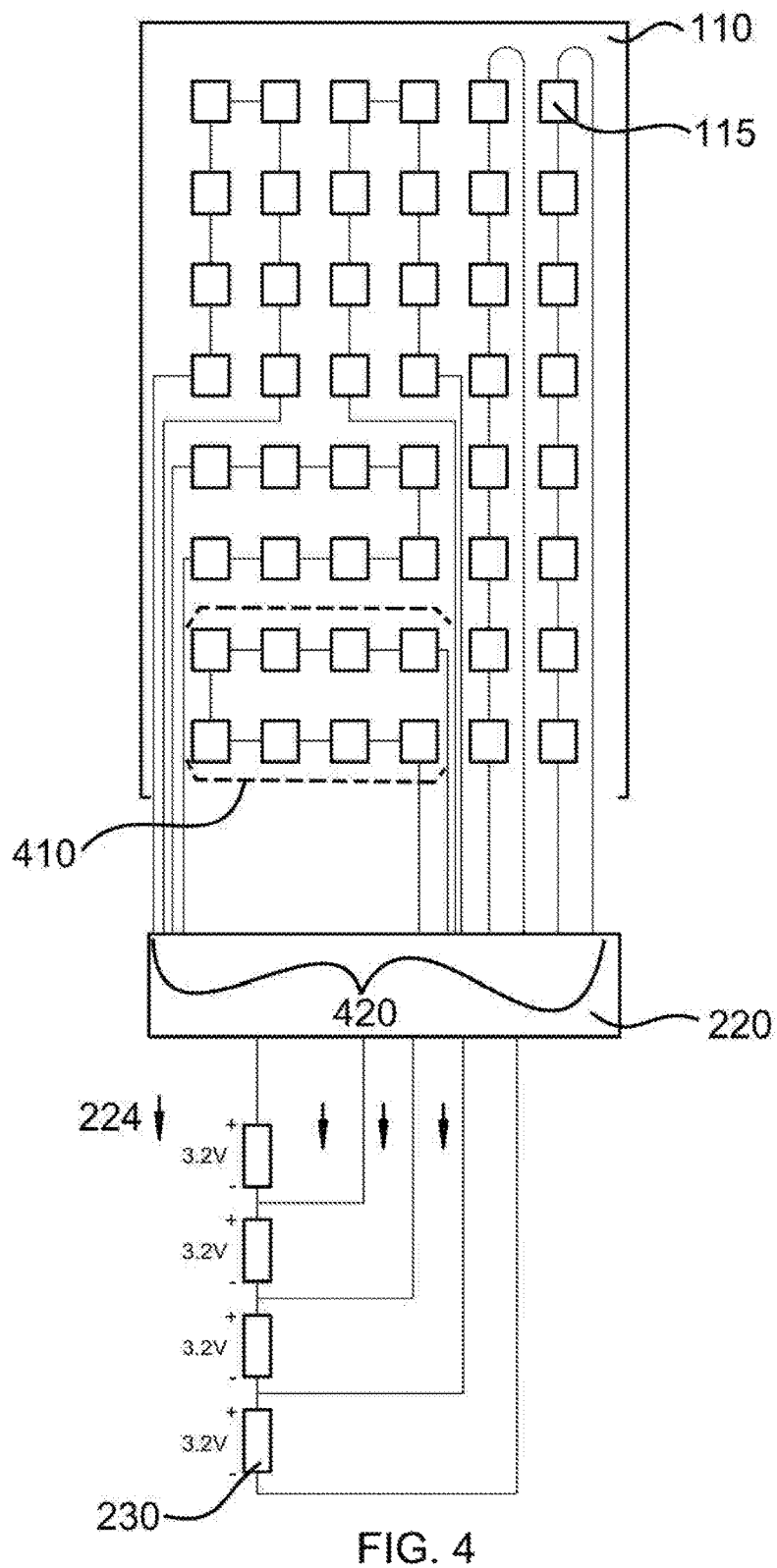
FIG. 4 is a diagram of a certain embodiment of the distributed charge control system with PV cell strings in rows and clustered groups, according to an embodiment of the system.

FIG. 4 is a diagram of a certain embodiment of the distributed charge control system with PV cell strings in rows and clustered groups. The PV strings within the clusters may be arranged in a variety of configurations such as horizontal, vertical, circular, and or diagonal, or a combination thereof. The PV strings may have an equal or unequal number of cells. Such configurations and number of cells may be useful in designing the system to accommodate locations where ambient and environmental conditions are likely to affect PV performance. PV module 110 is shown with six groups of eight PV cells 115. A cluster 410 comprises eight PV cells 115 at 0.5 volts each for a total of 4 volts for each string. All six 4 volt strings are connected 420 to charge controller 220. Current 224 indicated by arrows, flows into each of the battery cells 230 in order, charging each battery cell as required to meet each specific battery cell's charging profile. In this example each battery cell is charged to a nominal 3.2 volts.

FIGS. 5A, 5B, 5C and 5D illustrate various embodiments of the charge controller charging profiles for battery cells.

Figures 5A, 5B:
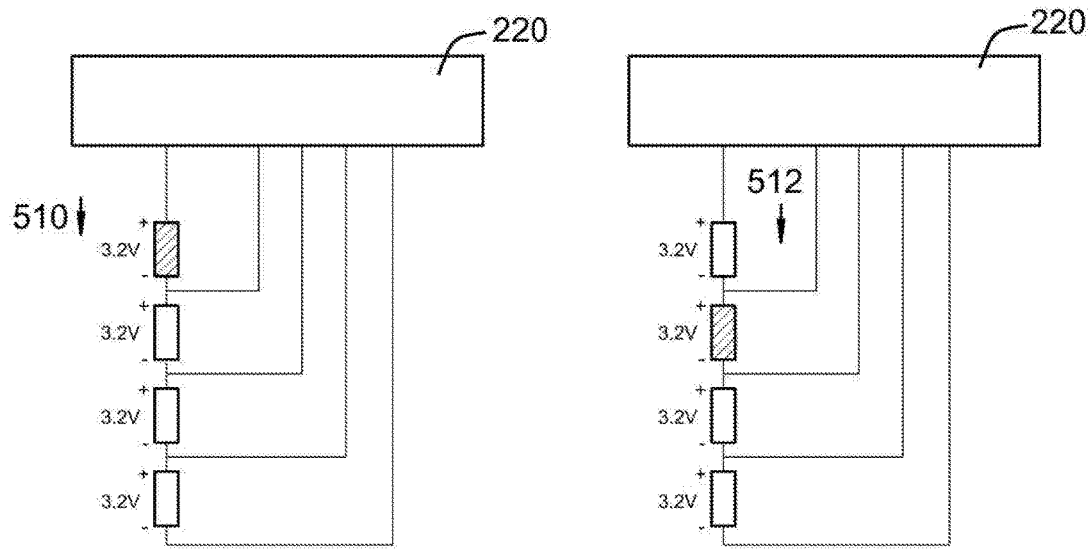
FIGS. 5A, 5B, 5C and 5D illustrate various embodiments of the charge controller charging profiles for battery cells.

FIG. 5A shows charge controller 220 charging 510 a first battery cell. In this example no other cells are being charged at this time. FIG. 5B shows charge controller 220 charging 512 a second battery cell after the first cell has been charged.

Figures 5C, 5D:
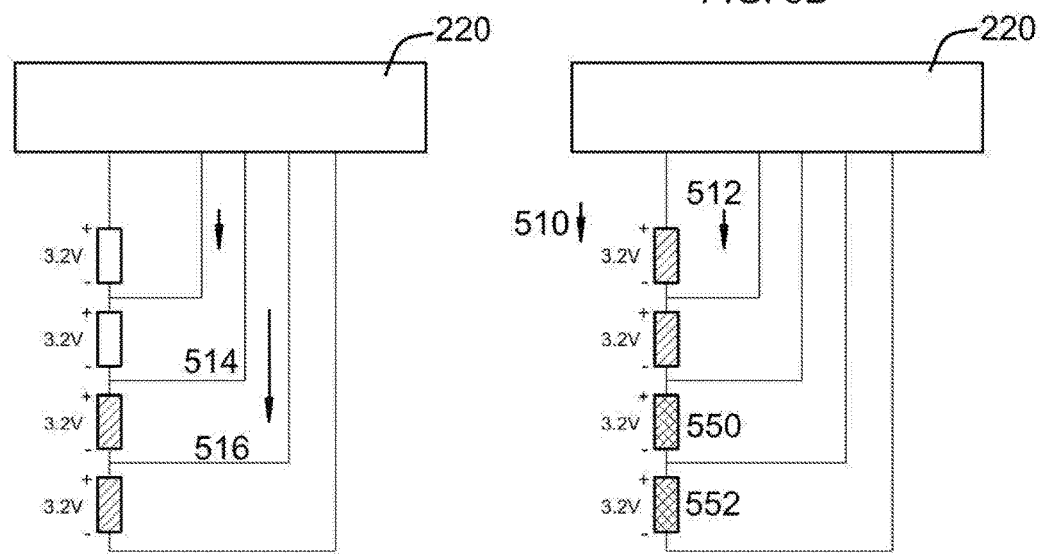

FIG. 5C shows two battery cells being simultaneously charged by charge current 514 and charge current 516. The charge controller 220 in this example utilizes the power from one or more strings of PV cells to distribute power at the same time to two different battery cells, matching two different charging profiles to meet the specific needs of each battery cell.

FIG. 5D illustrates charging currents 510 and 512 charging the first and second battery cells shown. Battery cell 550 and battery cell 552 are delivering power to electrical loads, and are not being charged at this time. The charge controller 220 actively manages the power production from the PV cells, the charging of the battery cells, along with the power delivery to electrical loads. Each of these actions are monitored and controlled as required to meet the changing requirements of each part of the system. There are also cases when the charge controller may pulse battery cells 550 and 552 to test various functions and capacities of these batteries. Testing may also require battery cells 550 and 552 to be disconnected from the electrical loads. Demand for the electrical loads, and timing of this demand is communicated to the charge controller 220 so that the testing and management functions may be carried out during a time period when power is not required.

Figure 6A:
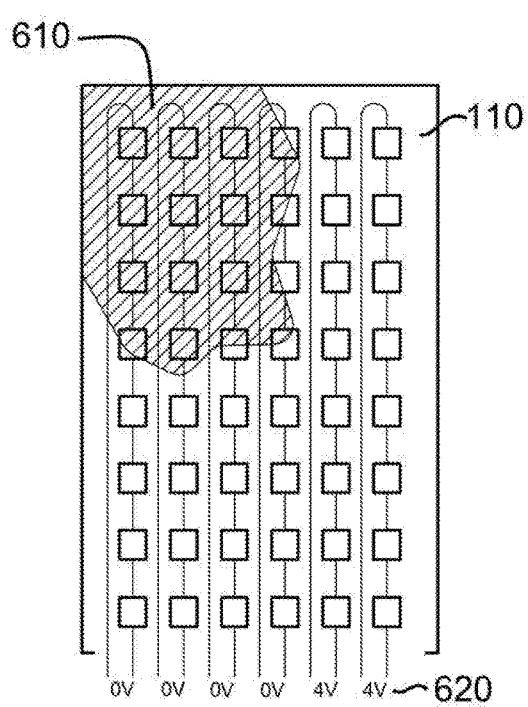
FIGS. 6A, 6b and 6C illustrate several various configurations of PV cell strings with shading covering a portion of the solar modules, according to certain embodiments of the system.
Figure 6B:
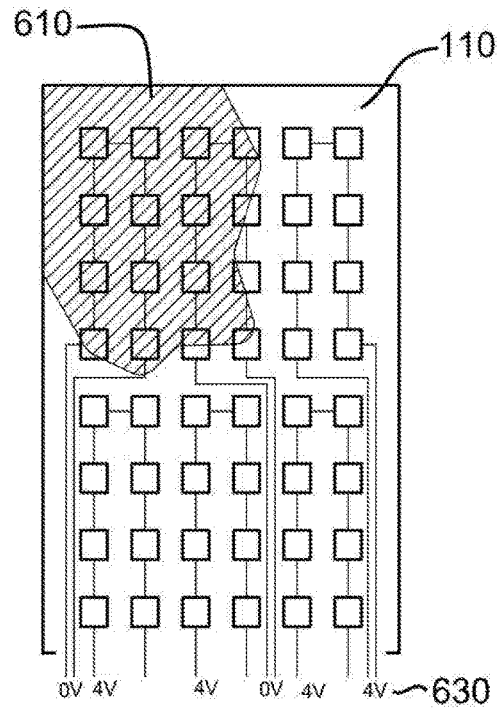
Figure 6C:
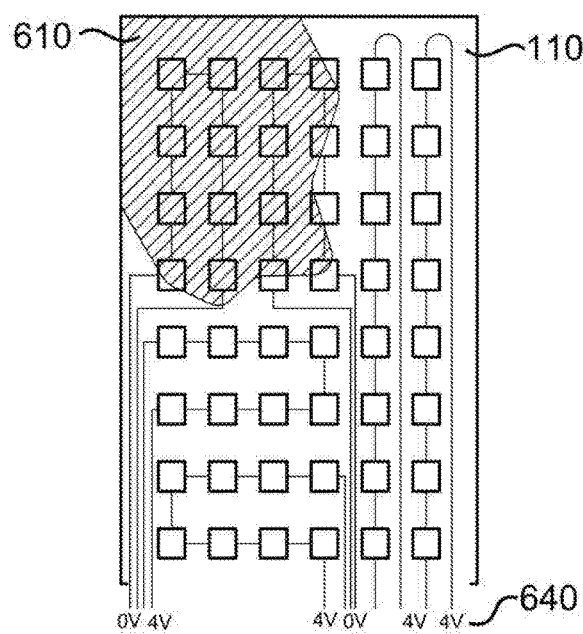

FIGS. 6A, 6b and 6C illustrate several various configurations of PV cell strings with shading covering a portion of the solar modules. In FIG. 6A, PV module 110 shows shading 610 from a tree or other obstruction partially covering four strings of PV cells. Voltage outputs 620 are shown as 0 volts for each shaded string and 4 volts for the active unshaded strings.

FIG. 6B, shows PV module 110 with shading 610 from a tree or other obstruction partially covering two strings of PV cells. In this embodiment, voltage outputs 630 are shown where only two strings produce 0 due to shading, and the other four strings are producing 4 volts.

FIG. 6C shows another embodiment wherein solar module 110 is partially shaded 610. Voltage outputs 640 are shown where only two strings produce 0 due to shading, and the other four strings are producing 4 volts.

Figure 7:
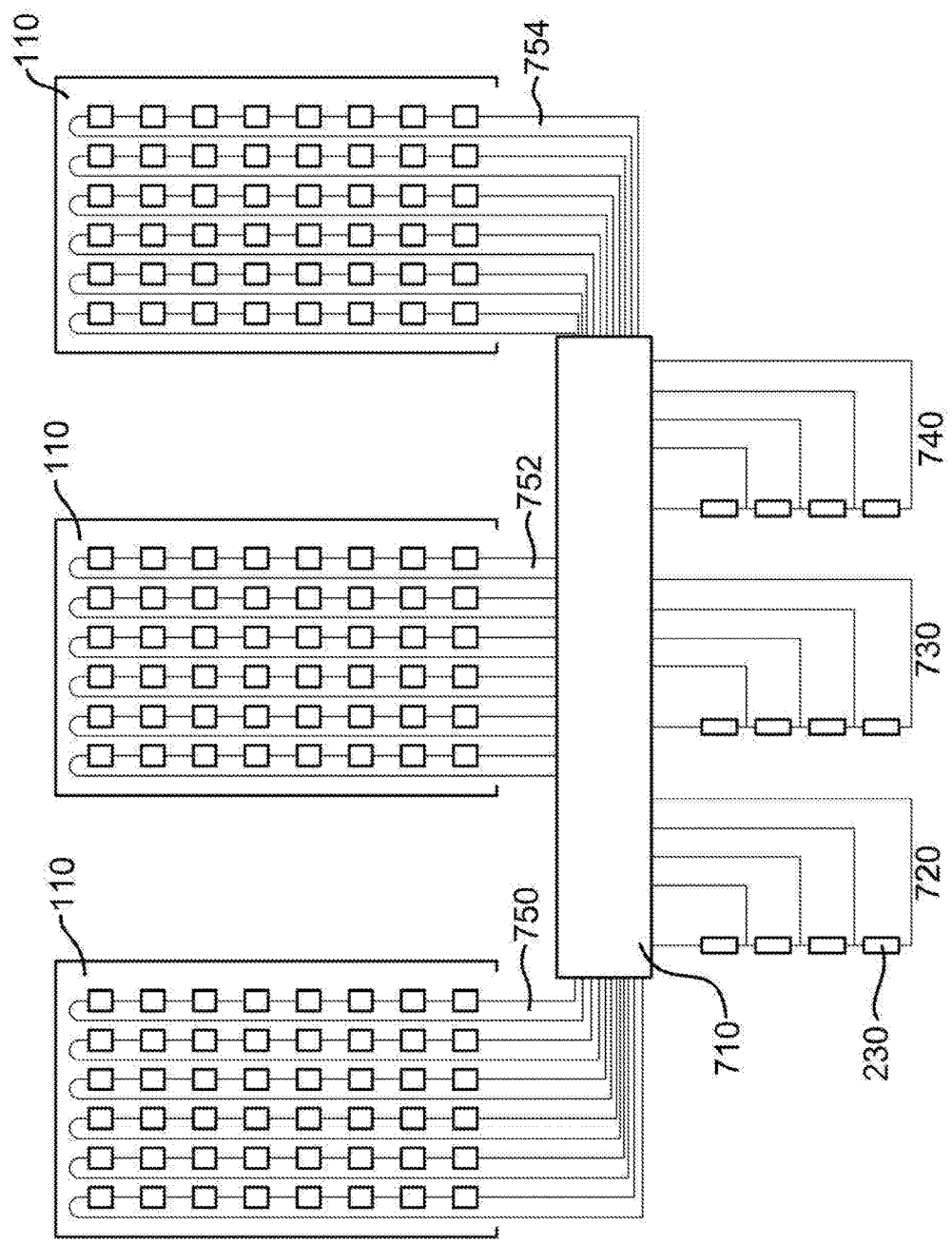
FIG. 7 is a diagram of three PV modules connected to a single charge controller that serves multiple battery packs, according to an embodiment of the system.

FIG. 7 is a diagram of three PV modules 110 connected to a single charge controller 710 that serves multiple battery packs 720, 730 and 740. Each battery pack has four battery cells 230. In this embodiment, strings from more than one PV module 110 are selected by the charge controller 710 to charge battery cells from one or more battery packs.

Figure 8:
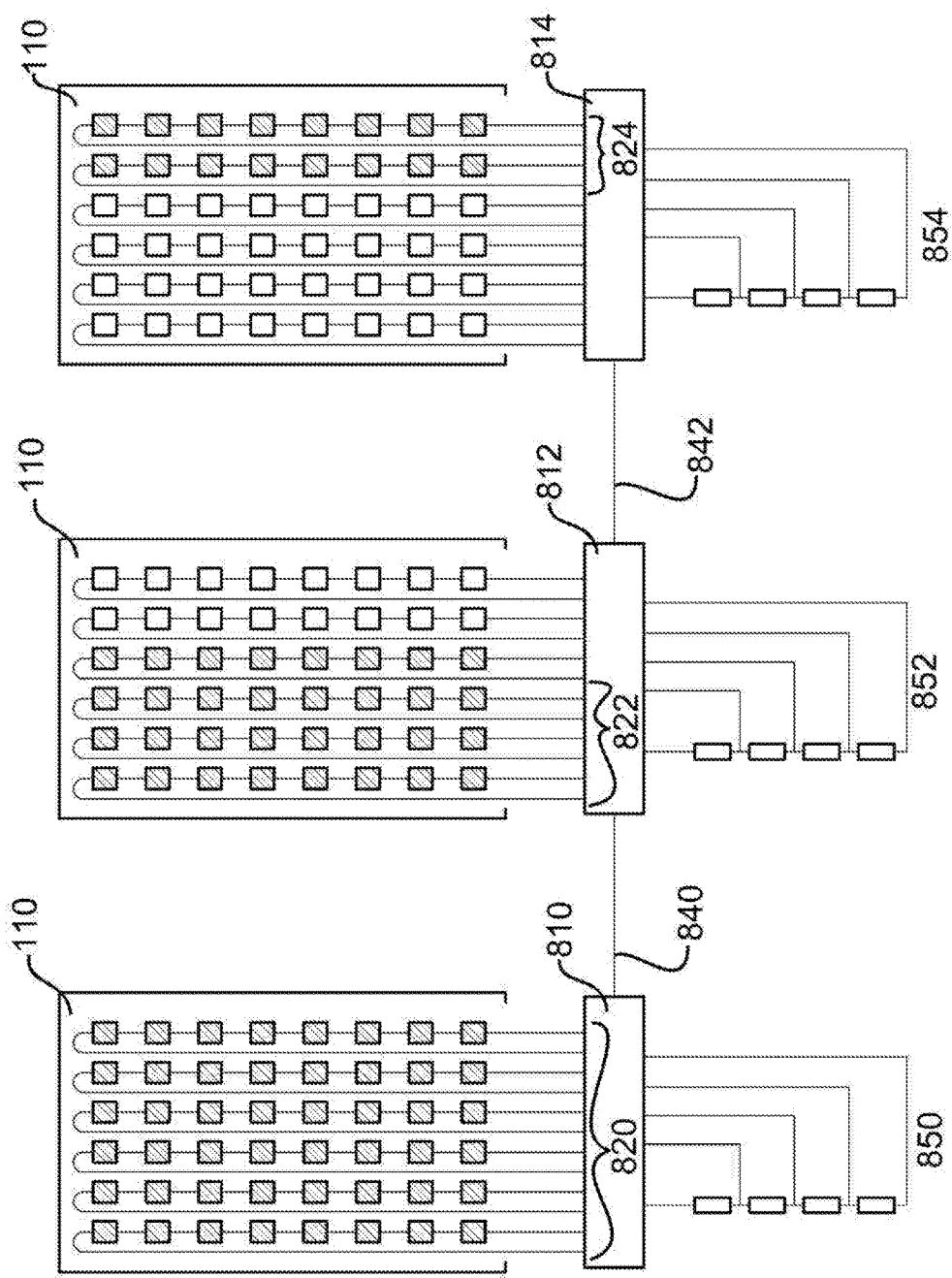
FIG. 8 is a diagram of three PV modules connected to three charge controllers that serve multiple battery packs, according to another embodiment of the system.

FIG. 8 is a diagram of three PV modules 110 connected to three charge controllers 810, 812 and 814 that serve multiple battery packs 850, 852 and 854. The three charge controllers are connected by wiring 840 and 842 which enable coordination of all functions between multiple systems. Both power and control functions are shared across wiring 840 and 842. In this example embodiment, all strings 820 in a first system are active and providing power to charge controller 810. Only four strings 822 are active in a second system providing power to charge controller 812. Two strings 824 are actively providing power to charge controller 814. All of the active strings may be used to charge any and all battery cells within battery banks 850, 852 and 854 as required.

Figure 9:
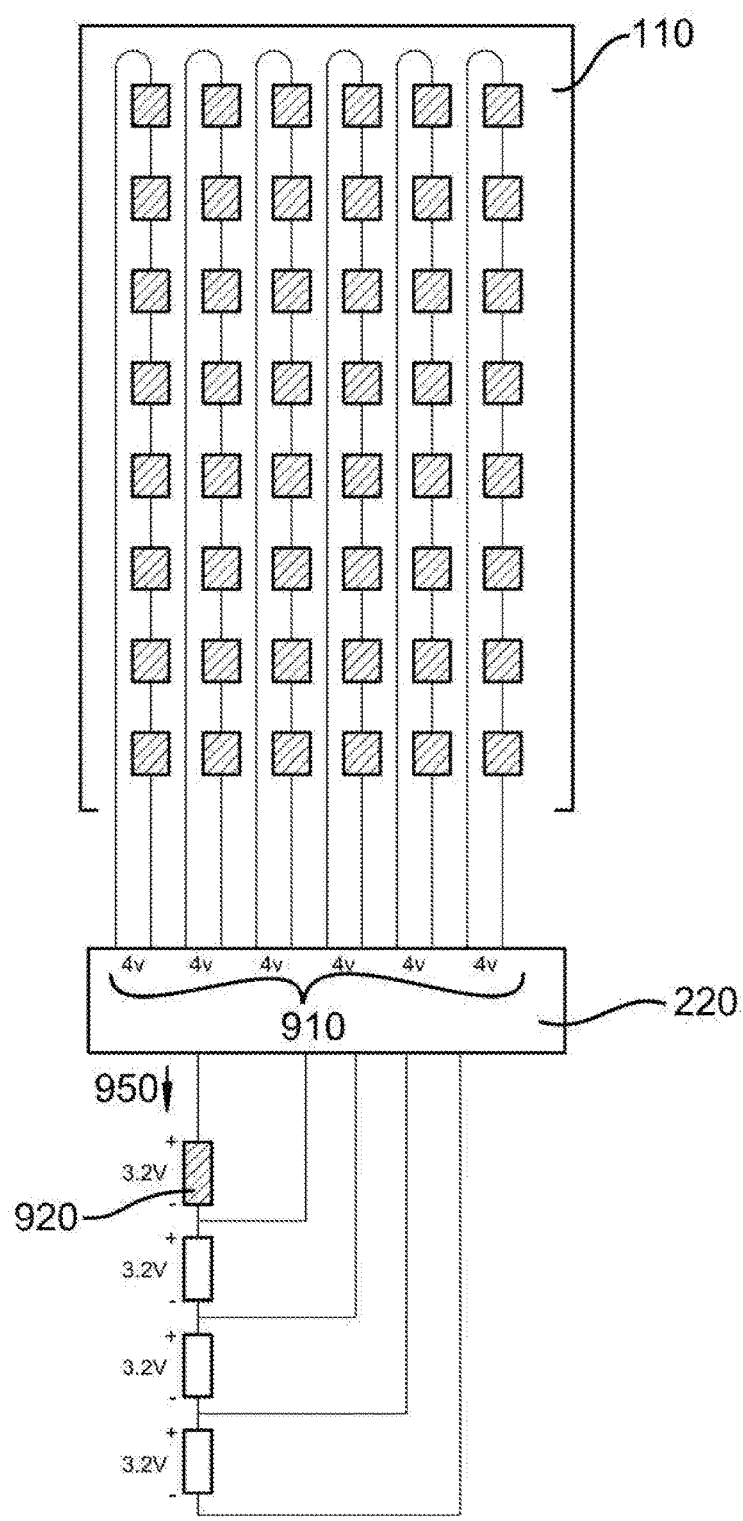
FIG. 9 is a diagram of a PV module with all strings active, according to an embodiment of the system.

FIG. 9 is a diagram of PV module 110 with all strings 910 active and producing 4 volts each to charge controller 220. In this example, the power is delivered via charging current 950 to a single battery cell 920.

Figure 10:
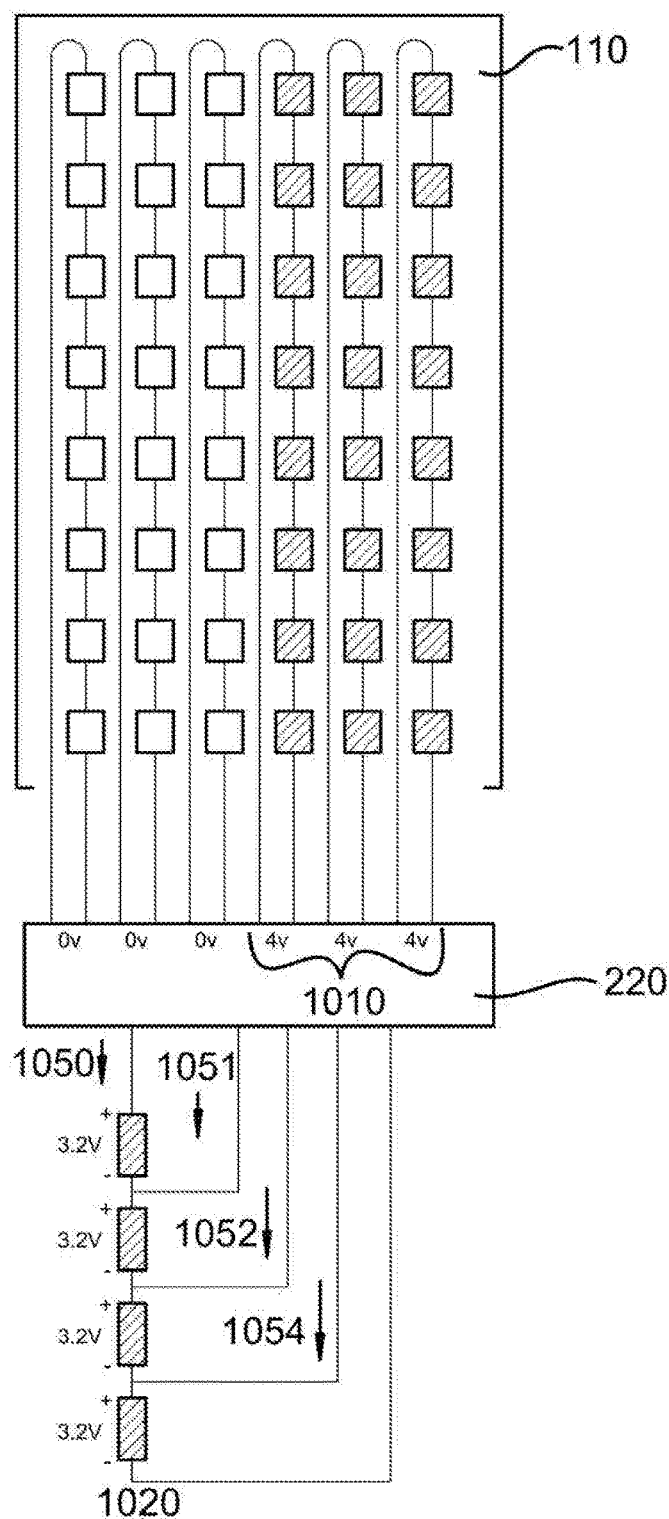
FIG. 10 is a diagram of a PV module with three strings active, according to another embodiment of the system.

FIG. 10 is a diagram of PV module 110 with three strings 1010 active and producing 4 volts each delivering power to charge controller 220. Power is delivered to each individual battery cell in battery bank 1020 via charging currents 1050, 1051, 1052 and 1054. In this embodiment, each charging current is different and specific to the charging profile of each individual battery cell.

Figure 11:
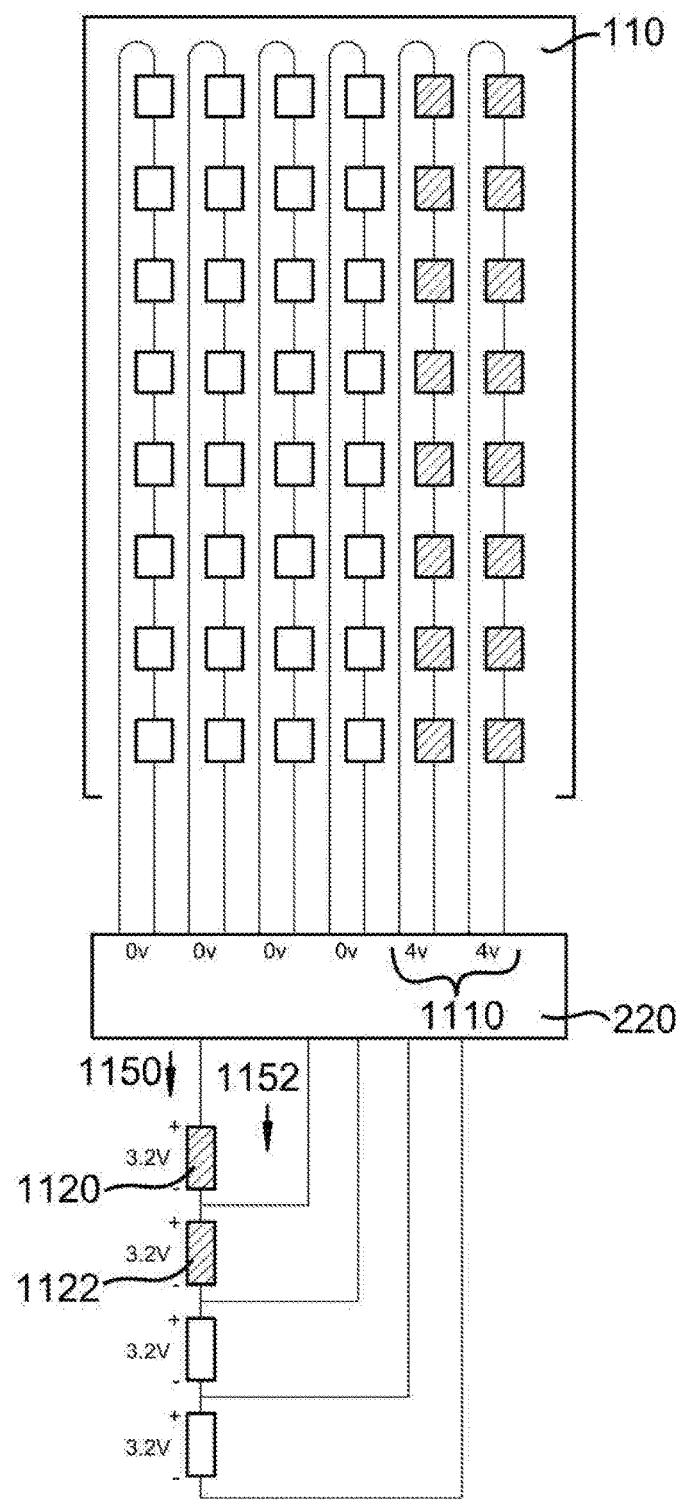
FIG. 11 is a diagram of a PV module with two active strings, according to an embodiment of the system.

FIG. 11 is a diagram of a PV module 110 with two active strings 1110 connected to charge controller 220 serving individual battery cells 1120 and 1122 via charging profiles 1150 and 1152 as shown. String to battery cell matching may be carried out with minimal active strings serving one or more individual battery cells. Even when there is low power output, individual battery cells may still be charged.

Although this invention has been described above with reference to particular means, materials and embodiments, it is to be understood that the invention is not limited to these disclosed particulars, but extends instead to all equivalents within the scope of the following claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A distributed charge control system comprising:
one or more photovoltaic (PV) modules producing a current, each PV module comprising one or more strings of PV cells connected in series;
a charge controller comprising a processor, memory and control electronics;
a battery bank comprising a plurality of battery cells connected in series;
wherein the charge controller selectively connects each string of the one or more strings of PV cells to selectively charge one or more of the battery cells based on predefined logic;
wherein the charge controller determines from sensor inputs, non-productive strings of the one or more strings of PV cells which are damaged or non-productive, and isolates the non-productive strings from the system; and
wherein the charge controller monitors and controls the use of each battery cell based on a scheduled health and maintenance profile stored in the memory, maintaining and updating the health and maintenance profile related to each individual battery cell.

2. The control system of claim 1, wherein each string of the one or more strings of PV cells is connected to a specific battery cell, the charge controller matching the voltage and current charging specifications of the specific battery cell.

3. The control system of claim 1, wherein two or more strings of the PV cells are connected to a first battery cell, the charge controller matching the voltage and current charging specifications of the first battery cell for a first period of time until the first cell is fully charged, whereupon the charge controller then switches charging to a second battery cell for a second period of time.

4. The control system of claim 1, wherein the charge controller further comprises maximum power point tracking logic and electronics.

5. The control system of claim 1, wherein the predefined logic comprises logic pre-programmed at a manufacturer; user defined logic; logic based on calculations from sensor inputs; and logic based on calculations from charts and lookup tables stored in the memory.

6. The control system of claim 5, wherein the sensor inputs are received from sensors both within the control system and outside of the control system comprising sensors that sense voltage; current; temperature; deformation of battery cells; increase in internal pressure inside battery cells; state of charge of individual battery cells; charge rate of cells; and discharge rate of cells.

7. The control system of claim 1, wherein the battery cells comprise lithium iron phosphate chemistry.

8. The control system of claim 1, wherein the sensor inputs further comprise identifying inputs from sensors that indicate battery chemistry type.

9. The control system of claim 8, wherein the control system adjusts charging current, and charging rate based on the identifying inputs indicating battery type.

10. The control system of claim 1, wherein the sensor inputs indicate a time period during which an unproductive string of PV cells are not producing minimum voltage and current levels because they are shaded or obstructed, whereupon the charge controller switches charging to a productive string of PV cells.

11. The control system of claim 1, wherein the charge controller connects multiple strings of the two or more strings of PV cells in one or more PV modules in series in order to increase the voltage output.

12. The control system of claim 11, wherein the charge controller of a first PV module is in communication with one or more charge controllers of one or more additional PV modules allowing the extension of all of the functions of a single distributed charge control system to a combined system of PV modules.

13. The control system of claim 1, wherein the charge controller selectively connects two or more strings of PV cells from two or more PV modules to selectively charge one or more of the battery cells based on the predefined logic.

14. The control system of claim 1, wherein the one or more strings of PV cells are arranged in one of horizontal, vertical, circular, and diagonal clusters, or a combination thereof.

15. A distributed charge control system comprising:
one or more photovoltaic (PV) modules producing a current, each PV module comprising one or more strings of PV cells connected in series;
a charge controller comprising a processor, memory and control electronics;
a battery bank comprising a plurality of battery cells connected in series;
wherein the charge controller selectively connects each string of the one or more strings of PV cells to selectively charge one or more of the battery cells based on predefined logic; and
wherein the charge controller determines from sensor inputs, non-productive strings of the one or more strings of PV cells which are damaged or non-productive, and isolates the non-productive strings from the system; and
wherein the charge controller adjusts a unique battery cell specific charging profile and discharge profile for each individual battery cell according to the health and maintenance profile for that unique battery cell.

16. A distributed charge control system comprising:
one or more photovoltaic (PV) modules producing a current, each PV module comprising one or more strings of PV cells connected in series;
a charge controller comprising a processor, memory and control electronics;
a battery bank comprising a plurality of battery cells connected in series;
wherein the charge controller selectively connects each string of the one or more strings of PV cells to selectively charge one or more of the battery cells based on predefined logic; and
wherein the charge controller determines from sensor inputs, non-productive strings of the one or more strings of PV cells which are damaged or non-productive, and isolates the non-productive strings from the system; and
wherein the charge controller calculates a target power based on a charging profile of the battery cell, and adjusts the charging and discharging of the battery cell based on the target power.

17. A distributed charge control system comprising:
one or more photovoltaic (PV) modules producing a current, each PV module comprising one or more strings of PV cells connected in series;
a charge controller comprising a processor, memory and control electronics;
a battery bank comprising a plurality of battery cells connected in series;
wherein the charge controller selectively connects each string of the one or more strings of PV cells to selectively charge one or more of the battery cells based on predefined logic; and
wherein the charge controller determines from sensor inputs, non-productive strings of the one or more strings of PV cells which are damaged or non-productive, and isolates the non-productive strings from the system; and
wherein the charge controller calculates a target group power based on a charging profile of a specific group of battery cells, and adjusts the charging and discharging of the specific group of battery cells based on the target group power.

18. The control system of claim 17, wherein the charge controller selectively combines power outputs of one or more strings of PV cells and one or more battery cells to meet an electrical load based on power requirements of the electrical load, the target power of the battery cells, and the power available from the one or more strings of PV cells.

* * * * *